United States Patent
Sander et al.

(10) Patent No.: US 8,077,404 B2
(45) Date of Patent: Dec. 13, 2011

(54) OPTICAL UNIT

(75) Inventors: Aloysius Fransiscus Maria Sander, Valkenswaard (NL); Koen Gerard Demeyer, Genk (BE); Edwin Maria Wolterink, Valkenswaard (NL)

(73) Assignee: Anteryon International B.V (NL)

( * ) Notice: Subject to any disclaimer, the term of this patent is extended or adjusted under 35 U.S.C. 154(b) by 48 days.

(21) Appl. No.: 12/646,175

(22) Filed: Dec. 23, 2009

(65) Prior Publication Data

US 2010/0157446 A1     Jun. 24, 2010

(30) Foreign Application Priority Data

Dec. 23, 2008  (NL) ..................................... 1036360

(51) Int. Cl.
*G02B 9/60*     (2006.01)
*G02B 9/62*     (2006.01)
(52) U.S. Cl. ........................ 359/763; 359/756
(58) Field of Classification Search .......... 359/708–715, 359/754–795
See application file for complete search history.

(56) References Cited

U.S. PATENT DOCUMENTS

| 7,821,725 B2 * | 10/2010 | Sato et al. ..................... 359/773 |
| 2005/0045975 A1 | 3/2005 | Kondo et al. |
| 2006/0262416 A1 | 11/2006 | Lee et al. |
| 2008/0230934 A1 | 9/2008 | Rudmann |
| 2009/0323206 A1 * | 12/2009 | Oliver et al. ................... 359/776 |
| 2010/0002314 A1 * | 1/2010 | Duparre ........................ 359/773 |
| 2010/0046096 A1 * | 2/2010 | Hirao et al. .................... 359/795 |
| 2010/0091387 A1 * | 4/2010 | Hirao et al. .................... 359/793 |

FOREIGN PATENT DOCUMENTS

| EP | 2 120 078 A1 | 11/2009 |
| WO | WO 2008/011003 | 1/2008 |
| WO | WO 2008/108011 | 9/2008 |

OTHER PUBLICATIONS

European Search Report for European Application No. EP 09 01 5925 dated May 17, 2010.
International Search Report and Written Opinion for corresponding Dutch priority Application No. 1036360.

* cited by examiner

*Primary Examiner* — Darryl J Collins
(74) *Attorney, Agent, or Firm* — Wood, Phillips, Katz, Clark & Mortimer

(57) ABSTRACT

The present invention relates to an optical unit. The present invention further relates to the use of such an optical unit. Such an optical unit comprises, seen in a direction from the object side to the imaging surface, a first substrate, a first lens element, a flat, transparent intermediate layer, a second lens element and a second substrate, which intermediate layer has an optically correcting function near the imaging surface.

30 Claims, 7 Drawing Sheets

OPTICAL UNIT

TECHNICAL FIELD

The present invention relates to an optical unit. The present invention further relates to the use of such an optical unit.

BACKGROUND OF THE INVENTION

Optical units are known per se, they are used inter alia in camera systems, and developers of such systems constantly strive to obtain smaller, lighter, thinner, better and cheaper camera systems. From International application WO 2004/027880 in the name of the present applicant, for example, there is known a camera system comprising an image capturing element, a lens element for projecting an object onto the image capturing element, a spacer for maintaining a predetermined distance between the lens element and the image capturing element, whilst furthermore a lens substrate is provided, on which the lens is disposed. From U.S. Pat. No. 6,985,307 there is furthermore known a lens assembly, according to which the optical length, which is defined as the distance from the object side of the imaging lens to the image-forming surface of a CCD or the like, must be short. Such a lens is often referred to as a compact lens, and in a mobile telephone, for example, the optical length must at least be shorter than the thickness of the telephone itself. The lens must furthermore be configured so that the image obtained with such a lens is visually acceptable. U.S. Pat. No. 6,985,307 thus provides a lens assembly made up of a first lens, a second lens and a third lens, of which lenses special requirements are made as regards the curvature, the distance between the lenses and the thickness of the lenses that are used. From International application WO 2008/01103 there is furthermore known a camera system comprising three substrate layers, on which five optical elements are formed.

The camera modules used in mobile telephones require more and more resolution and optical functionalities, and that within increasingly smaller dimensions. Thus, new lens systems must be developed, comprising lenses having a greater sag height, sometimes referred to as deeper lenses, which lenses must exhibit at least the same dimensional precision as the previously produced lenses. The present applicant has found that, using the current production methods, considerable efforts are required to realize the intended shape or dimensional precision in the increasingly deep lenses.

Thus it is an object of the present invention to provide an optical unit in which it is possible to realize the required shape precision of the lens system without this leading to undesirably increased dimensions of the optical unit.

SUMMARY OF THE INVENTION

The invention as described in the first paragraph is characterised in that there is provided an optical unit comprising, seen in a direction from the object side to the imaging surface, a first substrate, a first lens element, a flat, transparent intermediate layer, a second lens element and a second substrate, which intermediate layer has an optically correcting function near the imaging surface.

Using such an optical unit, the present applicant has found it possible to manufacture a lens system in which the use of a flat, transparent intermediate layer makes it possible to use comparatively less deep lenses than in an optical unit in which such a transparent intermediate layer is not used. It should be noted in this regard that the transparent intermediate layer thus used does not have a lens function as such, but that it influences the course of the light rays through the thickness of the intermediate layer itself and the index transition between air and the refractive index of the material of the intermediate layer itself. In a special embodiment, a third lens element is disposed against the first substrate, remote from the first lens element. In addition to that it is desirable if a fourth lens element is disposed against the second substrate, seen in the direction of the imaging surface. Especially, the first lens element and the first substrate are integral parts forming together a first lens group and the second lens element and the second substrate are integral parts forming together a second lens group.

In a special embodiment, the flat intermediate layer is preferably made of glass.

It has been found that when the flat intermediate layer is made of glass, the range within which the optical performance can be influenced is considerable, in particular if the third and the fourth lens element have an Abbe number in the 50-80 range and a refractive index in the 1.45-1.55 range, in particular if the first and the second lens element have an Abbe number in the 20-50 range and a refractive index in the 1.55-2.00 range.

In a special embodiment, on the other hand, it is desirable if the first, the second, the third and the fourth lens element have an Abbe number in the 20-50 range and a refractive index in the 1.55-2.00 range, in which connection it is in particular preferable if the first, the second, the third and the fourth lens element have a corresponding Abbe number and a corresponding refractive index.

In a special embodiment, the flat intermediate layer is preferably configured as a layer built up of several layers, thus making it possible to influence the optical performance of the optical unit according to what is needed.

Possible optically correcting functions near the imaging surface are: an anti-reflection function, an infrared filtering function and a diaphragm function.

To effect a stable and shape-precise bond between the intermediate layer and the first as well as the second lens element, an adhesive is preferably used, which adhesive is in particular selected from the group of UV curable and thermally curable adhesives.

In the optical unit according to the present invention, the third lens element is preferably a plano convex lens, the first lens element is a plano concave lens, the second lens element is a plano concave lens and the fourth lens element is a plano convex lens, whilst it is in particular preferable if the fourth lens element is a plano convex/concave lens. In another embodiment it is preferred to have at least one of the first and second lens element of the type plano convex, wherein the remaining lens element is of the type plano concave. In such an embodiment it is preferred to deposit an additional spacer between at least one of the lens element and the substrate. The main function of such a spacer is mechanical.

In a special embodiment of the optical unit, a diaphragm may be disposed between the third lens element and the first substrate, or an aperture may be present between the first substrate and the first lens element. Furthermore, embodiments are conceivable in which an additional layer, viz. a diaphragm or an infrared filter, is present on both sides of the second substrate.

Both the first and the second substrate used in the present optical unit comprise in particular a transparent glass plate, in which connection it can further be noted that in a specific embodiment the glass used for the first and the second substrate is preferably different from the glass used for the intermediate layer. In a special embodiment, the second substrate at the same time functions as a sensor screening plate.

The intermediate layer used in the present optical unit preferably has a thickness of 0.2-10 mm.

The present inventors have found that the object aimed at can be accomplished in particular if the first, the second, the third and the fourth lens element have been formed on the first and the second substrate, respectively, by using a replication method. Using the replication method it has been found to be possible in particular to manufacture lenses which have precisely predictable curvature. In addition, in special embodiments it is preferred to have a buffer layer, i.e. a flat replica layer forming a buffer layer, between the respective lens element and the relevant substrate. Using such a method and a flat intermediate layer, it has furthermore been found to be possible to replicate lenses exhibiting a high degree of shape precision on said flat intermediate layer. Especially, regarding the replication method itself, reference is made to U.S. Pat. No. 4,615,847 which is herein incorporated by reference.

The present optical unit can be used in particular in image processing units where small dimensions are essential, for example in camera units for mobile telephones, personal computers, digital cameras, surveillance cameras and the like, in which a CCD or CMOS is used.

Using the present invention, it has been found to be possible to combine polymers and glass, using a polymer for the first, the second, the third and (possibly) the fourth lens and a glass material for the first and the second substrate and also for the intermediate layer. Thus, lens designs having a low sag height on relatively thick substrates are used. An additional advantage is that flat glass plates can be worked with a high degree of precision, in particular by replicating a lens on such a surface.

The present invention will now be explained in more detail by means of a number of examples, in which connection it should be noted, however, that the present invention is by no means limited to such embodiments.

DETAILED DESCRIPTION OF THE INVENTION

Figure 1:
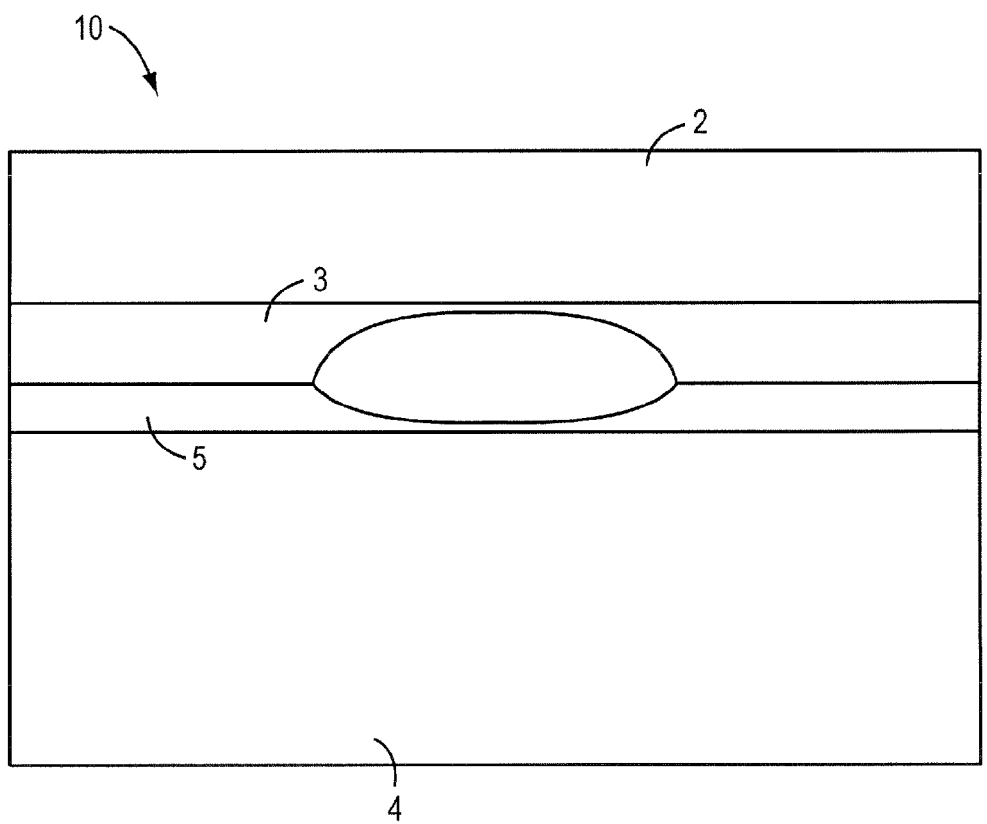
FIG. 1 shows an optical unit according to the prior art.

The optical unit 10 shown in FIG. 1 comprises a first substrate 2, on which a lens 3 is disposed, which lens 3 abuts against a lens 5, which lens 5 is disposed on the second substrate 4.

Figure 2:
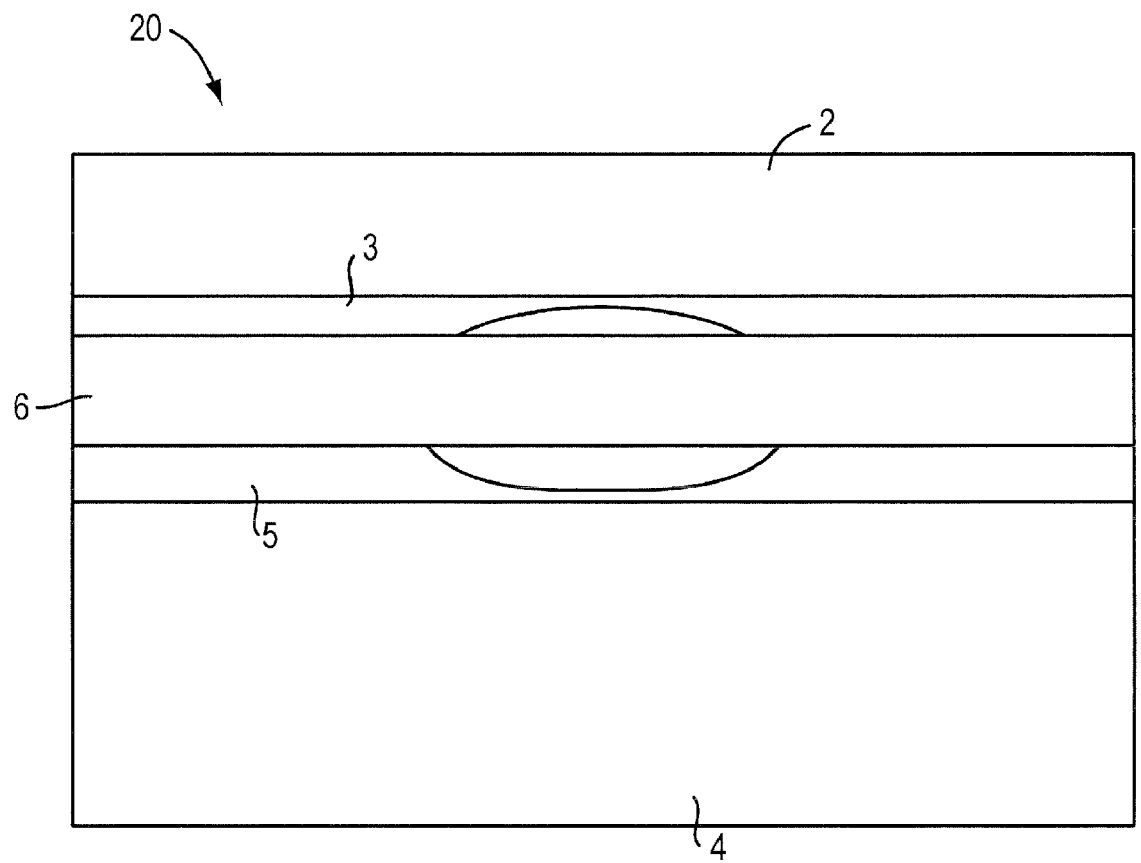
FIG. 2 shows an optical unit according to the present invention.

In FIG. 2 an optical unit 20 according to the present invention is schematically shown, which unit comprises a first substrate 2, a lens 3, which lens 3 is provided with a transparent intermediate layer 6 along the entire length thereof, which transparent intermediate layer 6 is additionally provided with a lens 5, disposed on a second substrate 4. The use of the intermediate layer 6 makes it possible to use lenses having a smaller height for realizing the same optical performance as with the optical unit 10 shown in FIG. 1. In a specific embodiment it is preferred that a buffer layer, i.e. a flat replica layer forming a buffer layer (not shown) is present between lens 3 and substrate 2, and/or between lens 5 and substrate 4.

Figure 3:
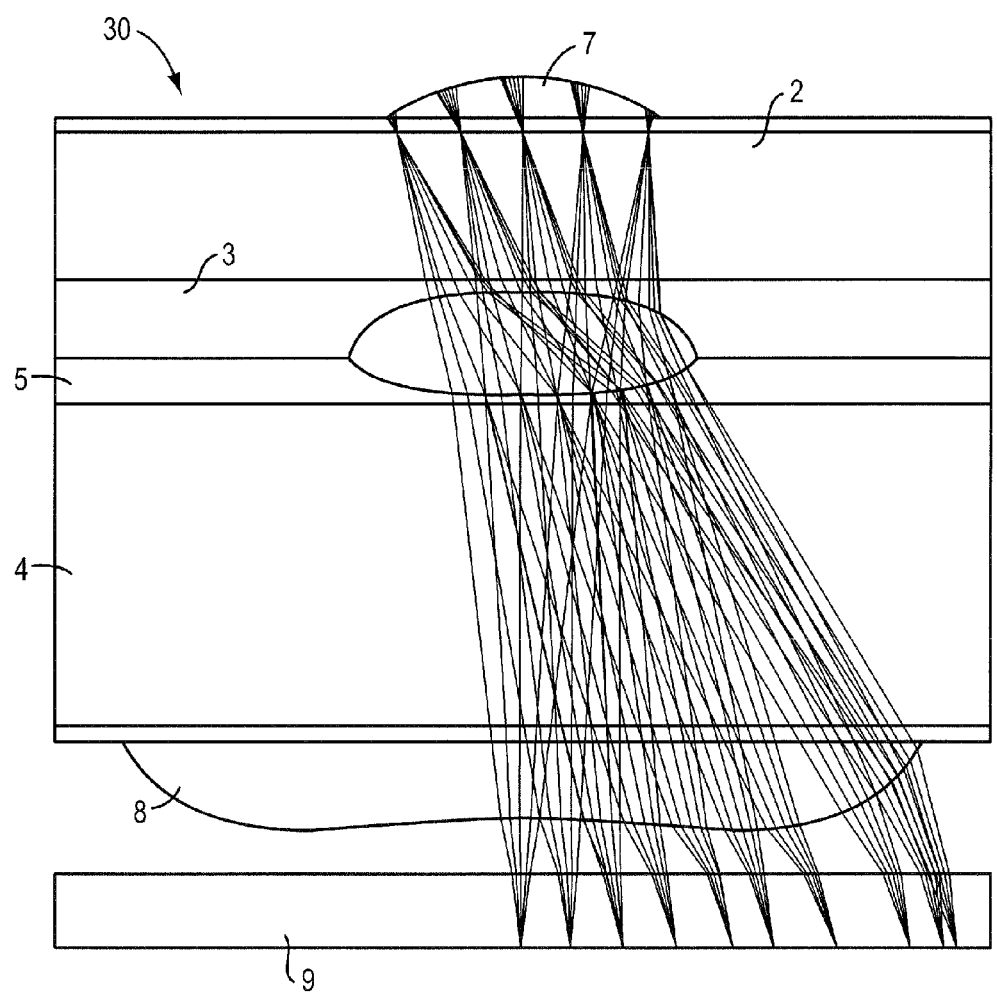
FIG. 3 shows another embodiment of an optical unit according to the prior art.

FIG. 3 schematically shows an optical unit 30 according to the prior art, comprising, seen in a direction from the object side to the imaging surface, a third lens 7, a first substrate 2, a first lens 3, a second lens 5, a second substrate 4 and a fourth lens 8, respectively. The figure also shows the path of rays through the optical unit 30, which rays are captured on an imaging sensor 9 (CMOS). In a specific embodiment it is preferred to have a buffer layer, i.e. a flat replica layer forming a buffer layer, between lens 7 and substrate 2, and/or between lens 8 and substrate 4.

Figure 4:
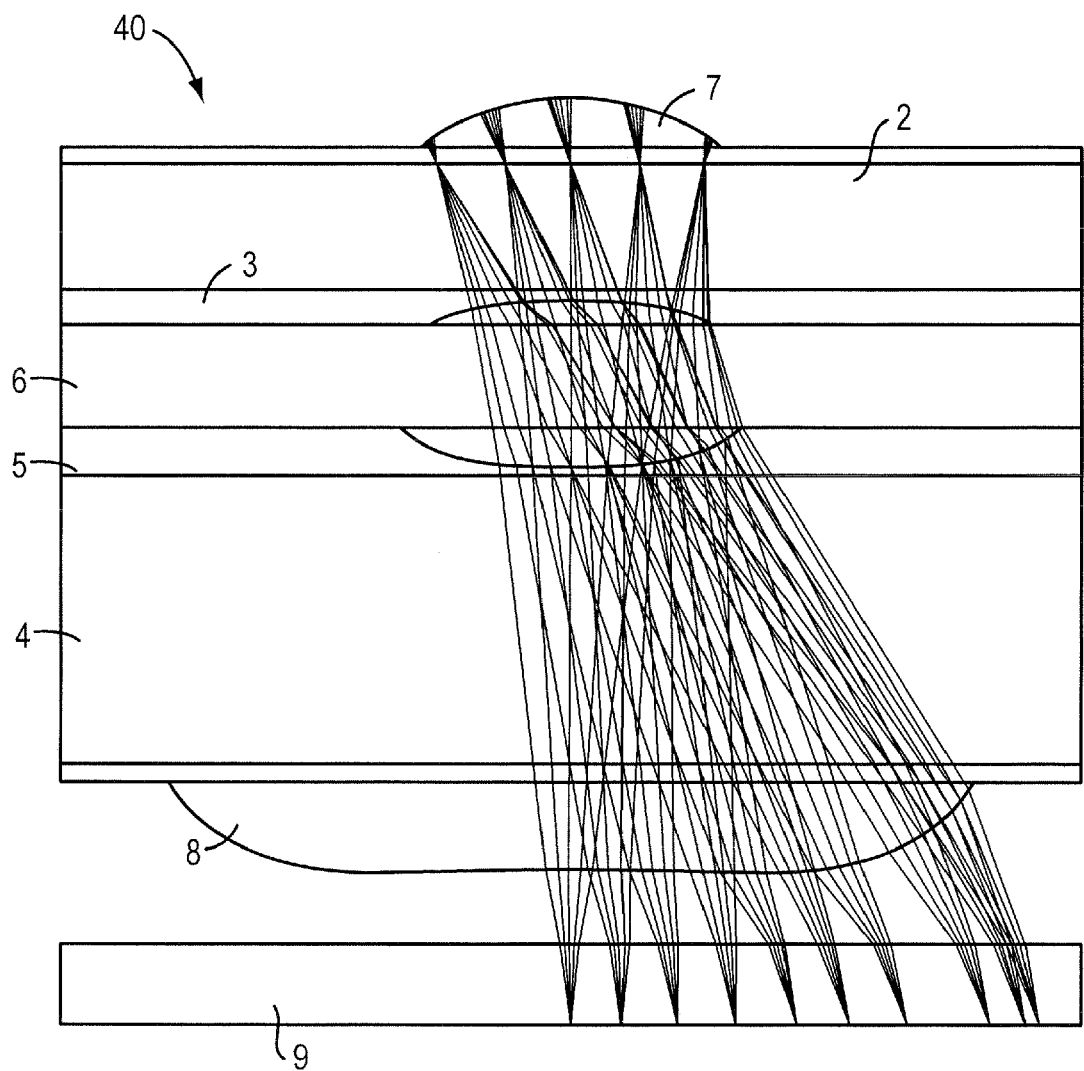
FIG. 4 shows another optical unit according to the present invention.

FIG. 4 schematically shows a path of rays through the optical unit 40 according to the present invention, which unit comprises, seen in a direction from the object side to the imaging surface, a third lens 7, a first substrate 2, a first lens 3, a flat, transparent intermediate layer 6, a second lens 5, a second substrate 4 and finally a fourth lens 8. Lens 7 as well as lens 3 are preferably formed on the first substrate 2 by means of the replication method. The same preference applies as regards the formation of lens 5 and lens 8 on the second substrate 4. After said two parts have been formed by means of the replication method, the two parts are permanently bonded to the intermediate layer 6, with an adhesive layer, preferably selected from the group of UV curable and thermally curable adhesives, being provided between the lens 3 and the intermediate layer 6 on the one hand and between the lens 5 and the intermediate layer 6 on the other hand. Subsequently, the whole is cured and an optical unit 40 is obtained. In such an optical unit 40, use is preferably made of glass type Schott B270 both for the first and the second substrate 2, 4 and Schott D263T for the intermediate layer 6. If the resin compositions used for the first, the second, the third and the fourth lens correspond to each other, a refractive index value of 1.565 and an Abbe number of 40.8 will lead to a good optical performance. It is also possible, however, to use the same resin for the third and the fourth lens, with a refractive index value of 1.510 and an Abbe number of 60.0 leading to a good optical performance, in combination with a refractive index value of 1.565 and an Abbe number of 40.8 for the first and the second lens.

Figure 5:
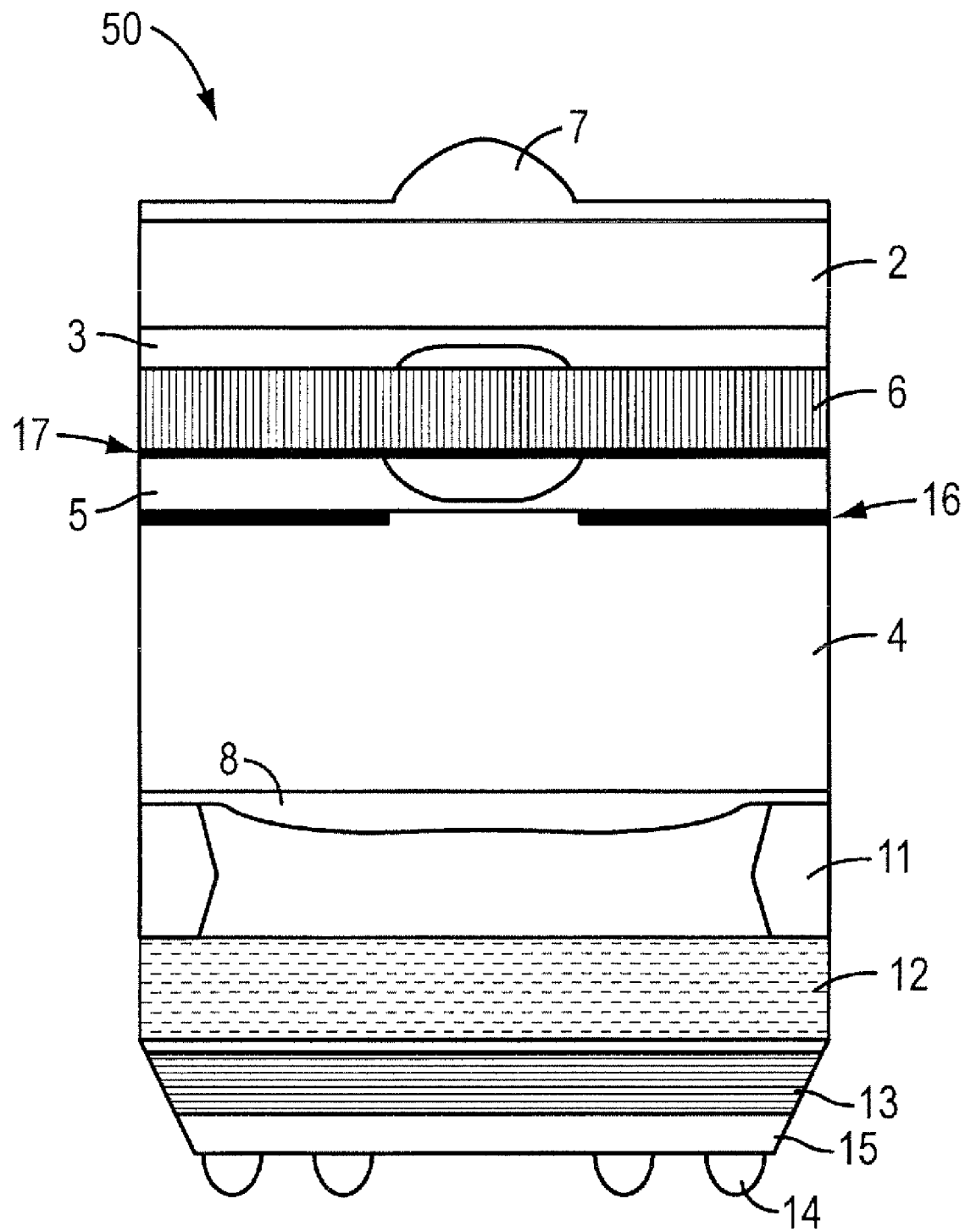
FIG. 5 shows a sensor in which an optical unit according to the present invention is used.

FIG. 5 schematically shows an optical sensor 50 according to the present invention, in which figure the same reference numerals as used in the above-discussed FIGS. 1-4 are used, where applicable. In particular, a diaphragm 16 is disposed between the lens 5 and the second substrate 4 in the optical unit 50. The assembly of lens 7 first substrate 2, a lens 3, intermediate layer 6, lens 5, second substrate 4 and lens 8 thus obtained is placed, via a spacer 11, on an imaging sensor comprising a cover plate 12, a colour filter 13, a CMOS layer 15 and a ball grid array 14. Adhesion between the spacer 11 and the image sensor on the one hand and the fourth lens 8 on the other hand is obtained by using an adhesive layer (not shown). In a specific embodiment it is desirable that an infrared filter 17 be present on the surface of the intermediate layer 6, between the lens 5 and the intermediate layer 6. An advantage of such a construction is that the lens 5 can be replicated on a "clean" second substrate. The present inventors have found that replicating a lens on a substrate provided with an infrared filter may lead to curvature problems. Thus it is desirable in certain embodiments that the infrared layer already be present on the intermediate layer 6, which infrared layer will then be disposed directly against the lens 5.

Figure 6:
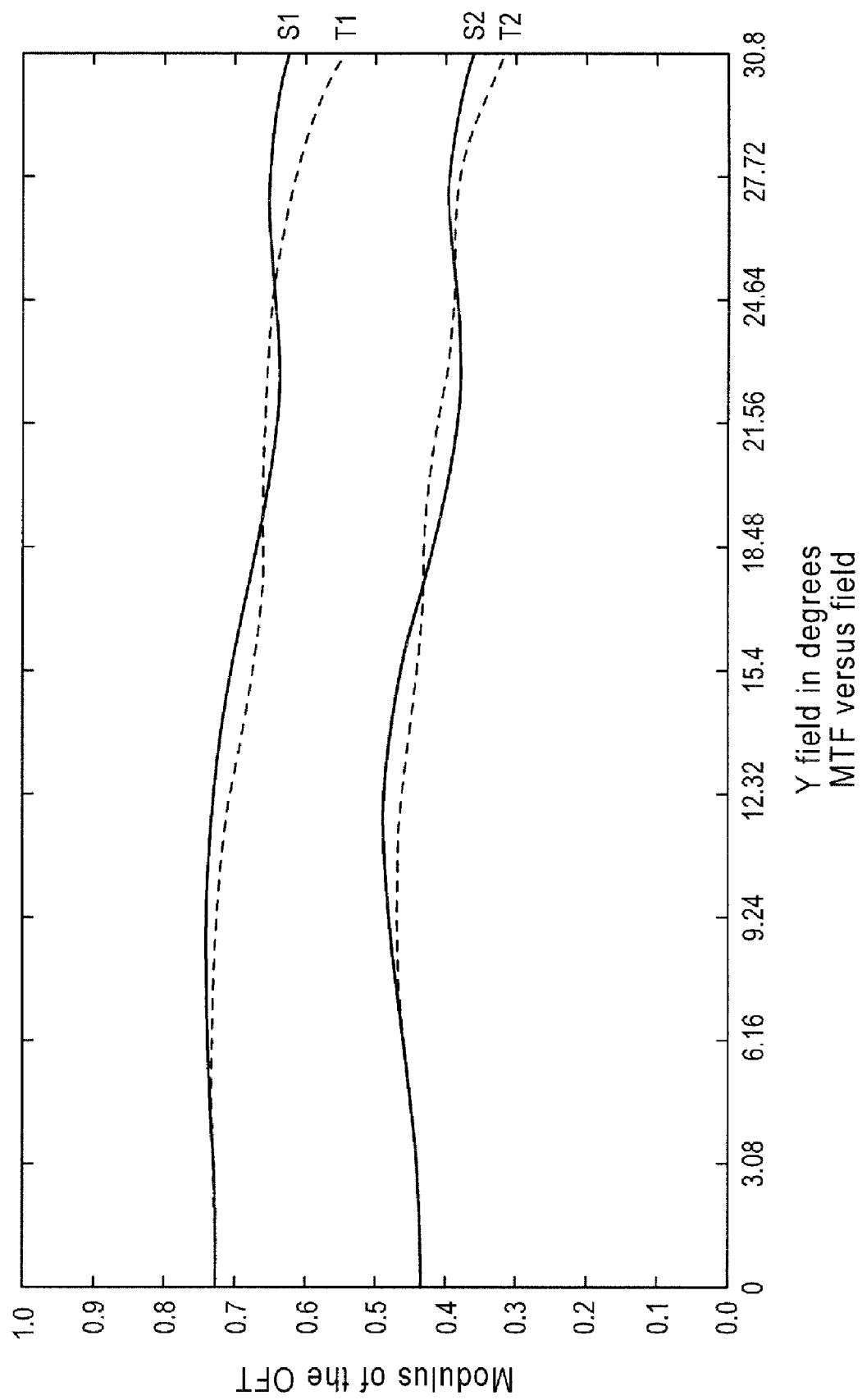
FIG. 6 graphically shows the imaging quality of the optical system according to FIG. 3.
Figure 7:
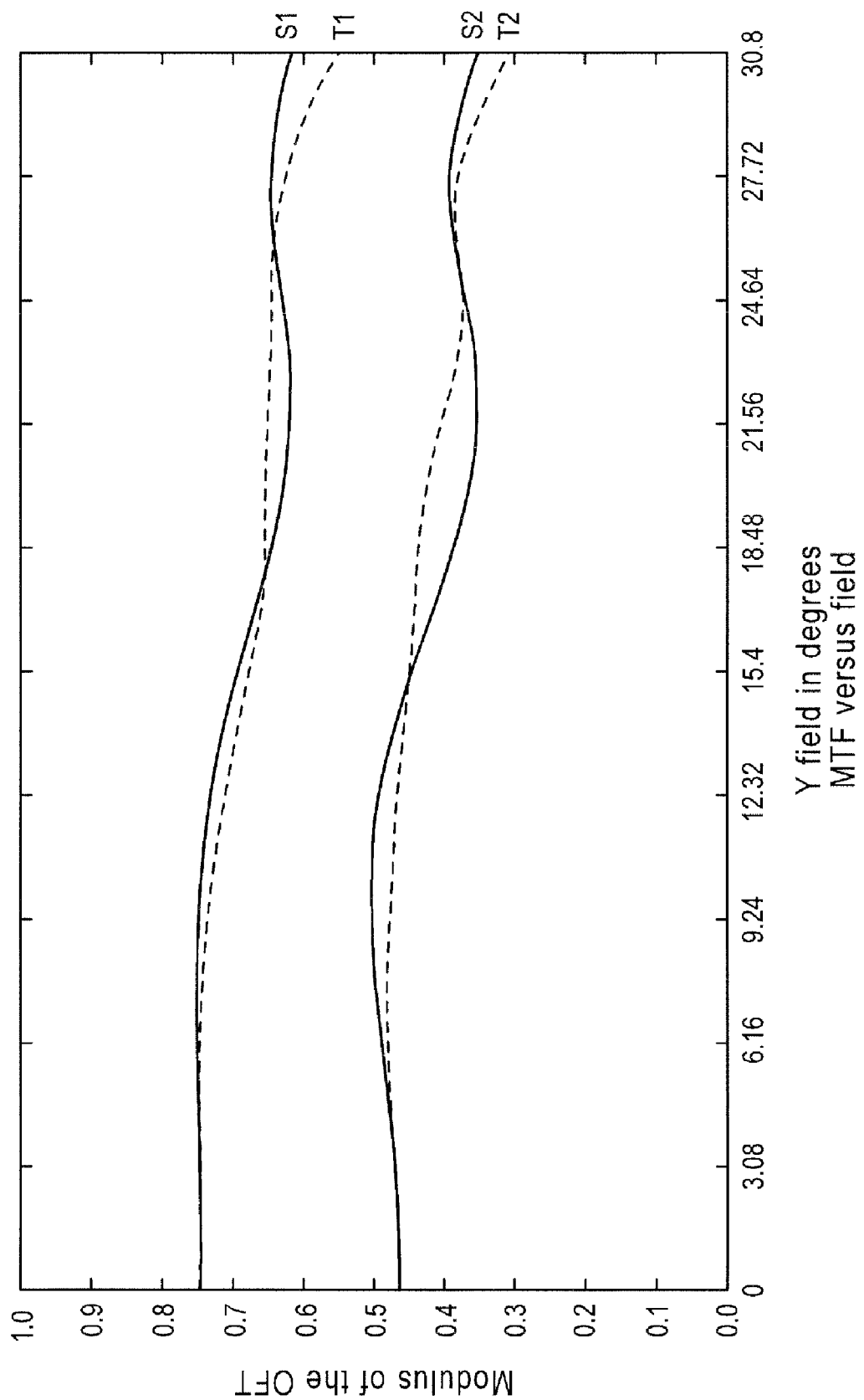
FIG. 7 graphically shows the imaging quality of the optical system according to FIG. 4.

From FIG. 6 and FIG. 7 it is apparent that the imaging quality of the present optical system according to FIG. 4 corresponds to that of the optical system according to FIG. 3.

What is claimed is:

1. An optical unit comprising, seen in a direction from the object side to the imaging surface, a first substrate, a first lens element, a flat, transparent intermediate layer, a second lens element and a second substrate, which intermediate layer has an optically correcting function near the imaging surface, wherein no other optical surface is provided between said first lens element and said transparent intermediate layer, or between said transparent intermediate layer and said second lens element.

2. An optical unit according to claim 1, characterised in that the flat intermediate layer is made of glass.

3. An optical unit according to claim 1, characterised in that the flat intermediate layer may comprise several layers.

4. An optical unit according to claim 1, characterised in that the flat intermediate layer has an anti-reflection function.

5. An optical unit according to claim 1, characterised in that the flat intermediate layer has an infrared filter function.

6. An optical unit according to claim 1, characterised in that the flat intermediate layer has a diaphragm function.

7. An optical unit according to claim 1, characterised in that the first lens element is a plano concave lens.

8. An optical unit according to claim 1, characterised in that the second lens element is a plano concave lens.

9. An optical unit according to claim 1, characterised in that an aperture is present between the first substrate and the first lens element.

10. An optical unit according to claim 1, characterised in that the intermediate layer has a thickness of 0.2-10 mm.

11. An optical unit according to claim 1, characterised in that the first lens element and the first substrate are integral parts forming together a first lens group and that the second lens element and the second substrate are integral parts forming together a second lens group.

12. Use of an optical unit as defined in claim 1, in an image processing unit, in particular a camera unit.

13. An optical unit according to claim 1, characterised in that both the first and the second substrate comprise a transparent glass plate.

14. An optical unit according to claim 13, characterised in that the glass used for the first and the second substrate is different from the glass used for the intermediate layer.

15. An optical unit according to claim 1, characterised in that a third lens element is disposed against the first substrate, remote from the first lens element.

16. An optical unit according to claim 15, characterised in that a fourth lens element is disposed against the second substrate, seen in the direction of the imaging surface.

17. An optical unit according to claim 16, characterised in that the fourth lens element is a plano convex lens.

18. An optical unit according to claim 16, characterised in that the first, the second, the third and the fourth lens element have been formed on the first and the second substrate, respectively, by using a replication method.

19. An optical unit according to claim 16, characterised in that the first, the second, the third and the fourth lens element have a corresponding Abbe number and a corresponding refractive index.

20. An optical unit according to claim 15, characterised in that the third lens element is a plano convex lens.

21. An optical unit according to claim 15, characterised in that a diaphragm is disposed between the third lens element and the first substrate.

22. An optical unit comprising, seen in a direction from the object side to the imaging surface a first substrate, a first lens element, a flat, transparent intermediate layer, a second lens element and a second substrate, which intermediate layer has a optically correcting function near the imaging surface, characterised in that the intermediate layer is connected to the first lens element and the second lens element by means of an adhesive.

23. An optical unit according to claim 22, characterised in that said adhesive has been selected from the group of UV curable and thermally curable adhesives.

24. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that a fourth lens element is disposed against the second substrate, seen in the direction of the imaging surface, and further characterised in that the fourth lens element is a plano convex lens, and that the fourth lens element is a plano convex/concave lens.

25. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that between the first lens element and the first substrate a flat replica layer forming a buffer layer is present.

26. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that between the second lens element and the second substrate a flat replica layer forming a buffer layer is present.

27. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that a fourth lens element is disposed against the second substrate, seen in the direction of the imaging surface, and further characterised in that the third and the fourth lens element have an Abbe number in the 50-80 range and a refractive index in the 1.45-1.55 range.

28. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that the first and the second lens element have an Abbe number in the 20-50 range and a refractive index in the 1.55-2.00 range.

29. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that a fourth lens element is disposed against the second substrate, seen in the direction of the imaging surface, and further characterised in that the first, the second, the third and the fourth lens element have an Abbe number in the 20-50 range and a refractive index in the 1.55-2.00 range.

30. An optical unit comprising, seen in a direction from the object side to the imaging surface, a first substrate, a first lens element, a flat, transparent intermediate layer, a second lens element and a second substrate, which intermediate layer has an optically correcting function near the imaging surface, characterised in that the second substrate at the same time functions as a sensor screening plate.

* * * * *